United States Patent [19]

Murakami et al.

[11] Patent Number: 4,888,202

[45] Date of Patent: Dec. 19, 1989

[54] METHOD OF MANUFACTURING THIN COMPOUND OXIDE FILM AND APPARATUS FOR MANUFACTURING THIN OXIDE FILM

[75] Inventors: Toshiaki Murakami; Kazuyuki Moriwaki, both of Mito, Japan

[73] Assignee: Nippon Telegraph and Telephone Corporation, Tokyo, Japan

[21] Appl. No.: 76,737

[22] Filed: Jul. 23, 1987

[30] Foreign Application Priority Data

Jul. 31, 1986 [JP] Japan ............................ 61-180661
Oct. 23, 1986 [JP] Japan ............................ 61-252486

[51] Int. Cl.$^4$ ....................... C23C 14/24; C23C 14/48
[52] U.S. Cl. ........................................ 427/42; 427/38;
427/255.2; 427/255.3; 156/610; 156/612; 156/614
[58] Field of Search ............. 427/38, 42, 255.2, 255.3; 204/192.31; 156/614, 610, 612

[56] References Cited

U.S. PATENT DOCUMENTS

| 4,314,874 | 2/1982 | Abe et al. | 427/38 |
| 4,333,226 | 6/1982 | Abe et al. | 427/38 |
| 4,351,712 | 9/1982 | Cuomo et al. | 427/38 |

FOREIGN PATENT DOCUMENTS

| 58-2022 | 1/1983 | Japan | 156/612 |
| 168915 | 7/1986 | Japan | 427/38 |

OTHER PUBLICATIONS

Bunshah et al., *Deposition Technologies for Films & Coatings*, (Noyes, Park Ridge, N.J.) c. 1982, pp. 92–93.

Vossen et al., ("Harper"), *Thin Film Processes*, (Academic Press, NY) c. 1978, p. 186.
Applied Optics; vol. 22, No. 1; Jan. 1, 1983 "Ion-Beam-Assisted Deposition of Thin Films".
Journal of Materials Science 21 (1986) pp. 1–25, "Review Ion-Based Methods for Optical Thin Film Deposition".
G. Dearnaley, et al., Ion Implantation, North-Holland Publishing Co., New York, 1973 (cover page only).
John R. McNeil et al., Ion-Assisted Deposition of Optical Thin Films: Low Energy vs High Energy Hombardment, in Applied Optics, vol. 23, No. 4, Feb. 15, 1984.
M. Kawabe et al., Effects of Ion Etching on the Properties of GaAs, in Applied Optics, vol. 17, No. 16, Aug. 15, 1978.
Shigeyuki Ishii et al., Optimization of Plasma for ECR-type Ion Source.

*Primary Examiner*—Richard Bueker
*Attorney, Agent, or Firm*—Frishauf, Holtz, Goodman & Woodward

[57] ABSTRACT

In a method of manufacturing a thin film of a compound oxide, different types of materials for forming the compound oxide are evaporated in vacuum. The evaporated materials are heated and deposited on a substrate to form a thin film. An oxygen ion beam having energy of 10 to 200 eV is implanted in the thin film which is being formed on the substrate. Alignment of the constituting elements is performed on the basis of a substrate temperature and energy of the oxygen ion beam, thereby causing epitaxial growth.

6 Claims, 2 Drawing Sheets

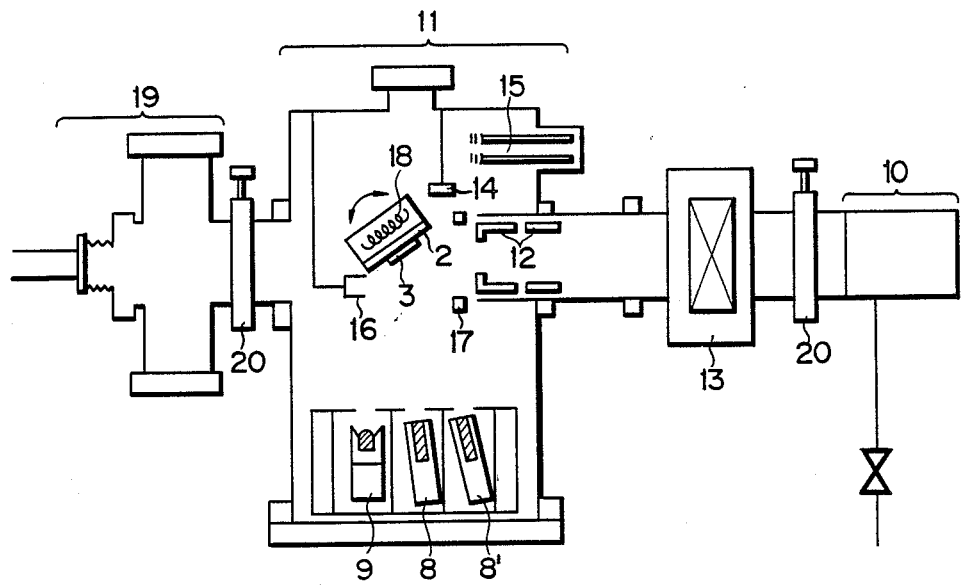
F I G. 1
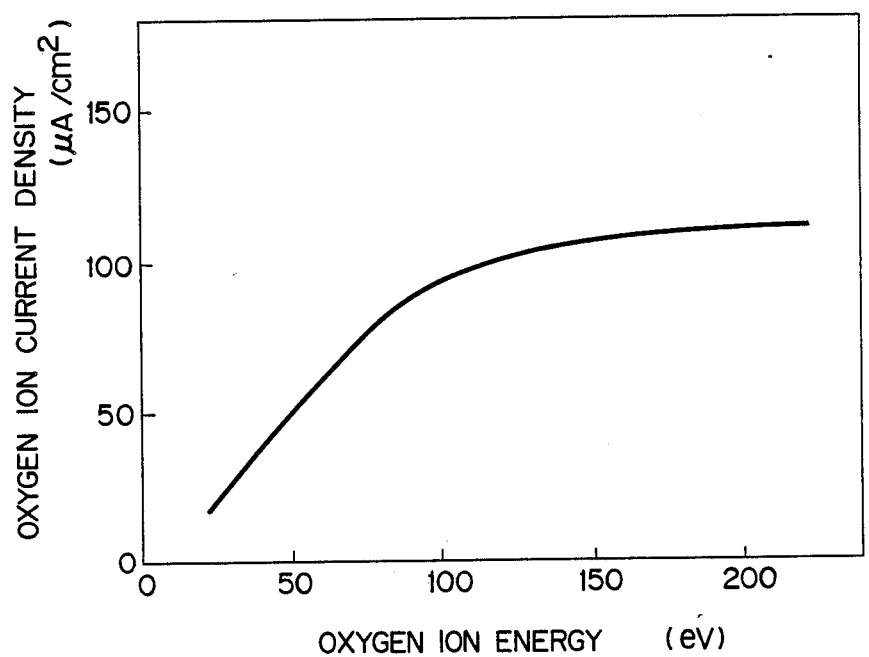
F I G. 2

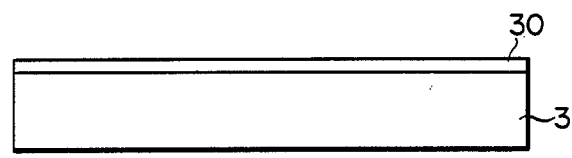
F I G. 3
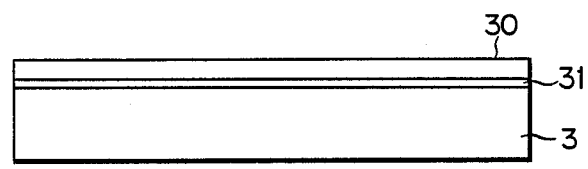
F I G. 4
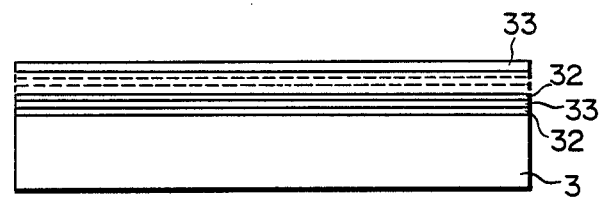
F I G. 5

METHOD OF MANUFACTURING THIN COMPOUND OXIDE FILM AND APPARATUS FOR MANUFACTURING THIN OXIDE FILM

BACKGROUND OF THE INVENTION

The present invention relates to a method of manufacturing a thin compound oxide film used in a light modulation element, a piezoelectric element, a surface acoustic wave element, an oxide superconductor element, an LSI, and an EL and an apparatus for manufacturing a thin oxide film.

A known conventional method of manufacturing a thin compound oxide film is a sputtering method. In this method, epitaxial growth of the thin film can be performed to prepare a single-crystal composite oxide such as $PZT[Pb(ZrTi)O_3]$, $PLZT[(PbLa)(ZrTi)O_3]$, $PbTiO_3$, and $BaPb_{1-x}Bi_xO_3$.

Successful examples of the methods of sputtering thin compound oxide films are limited to those for a limited number of oxides described above. Since control of the oxygen content depends on an oxygen partial pressure, control on the atomic level cannot be accomplished. Good reproducibility cannot be assured due to change in a target composition ratio with time. Thus, oxygen defects are formed in the resultant thin film, density of the film is lowered, or composition errors occur. Therefore, thin films required in other various fields of applications cannot be obtained. In addition, according to a conventional sputtering method, a gas is adsorbed on the surface of the substrate. In order to epitaxially grow atomic particles bombarding the surface of the substrate, atoms deposited on the substrate must be moved to a proper crystal site and must be aligned. However, such movement of atoms is prevented by the adsorbed gas. In the case of an oxide film, oxygen atoms for forming an oxide in addition to the adsorbed gas prevent movement of the deposited atoms. For these reasons, the substrate must be heated to a temperature of 500° C. or higher. As a result, film constituting elements are undesirably diffused into the under-layers if they are multilayered films having different materials.

Another conventional technique for forming a thin film is to deposite a material onto a substrate and at the same time to implant oxgen ion beams, as described in "ion-beam-assisted deposition of thin films" (APPLIED OPTICS, Vol. 22, No. 1, Jan. 1, 1983, P. J. Martin et al.) and "Review ion-based methods for optical thin film deposition" (JOURNAL OF MATERIALS SCIENCE 21 (1986) PP. 1-25, P. J. Martin).

The former literature deals with a thin film of an oxide of a simple substance such as $TiO_2$, unlike in the thin film of a compound oxide according to the present invention. In addition, energy of an ion beam is as high as 600 to 750 eV, and the resultant thin film tends to be amorphous. In the latter literature, since an operation gas pressure of an ion source is $1 \times 10^{-4}$ Torr or more, no deposition is performed in a high vacuum. Deposition molecules of the material repeatedly collide with a residual gas and reach the substrate. Therefore, no controlled molecular beam can be obtained. In addition, adsorption occurs on the substrate surface due to a residual gas. Therefore, an initiation temperature of epitaxial growth is undesirably increased. Energy of the oxygen ion beam incident on the substrate adversely affects crystallinity of a thin film to be formed. Selective control of the energy range for preventing crystal defects cannot be performed. The implanted oxygen beam includes $O^+$, $O_2^+$, $O_2^{++}$, and $O$ (neutral). The accurate number of oxygen atoms incident on the substrate cannot therefore be controlled.

SUMMARY OF THE INVENTION

The present invention has an object to eliminate the conventional drawbacks described above, and has as its object to provide a method of manufacturing a thin film of a compound oxide wherein energy of an oxygen beam can be optimized, precise composition control can be achieved, a high-density thin oxide film can be formed, and low-temperature epitaxial growth can be achieved by a combination of an energy effect of the oxygen beam and a high vacuum, and an apparatus for forming a thin oxide film.

In order to achieve the above object of the present invention, there is provided a method of manufacturing a thin compound oxide film, comprising the steps of: evaporating different types of elements for forming a compound oxide; depositing the different types of evaporated elements on a substrate and moving the deposited elements to a proper crystal site; and implanting oxygen ions or neutral oxygen particles having energy of 10 to 200 eV in a growing thin film, and aligning the elements and the oxygen ions or neutral oxygen particles as a crystal film of a compound oxide, thus epitaxially growing the thin compound oxide film.

An apparatus for forming a thin oxide film comprises a film formation chamber which is adapted to be evacuated and in which a substrate is placed; material feed means for feeding a material of a thin oxide film to be formed on the substrate; oxygen ion generating means; mass separating means for separating oxygen ions from an oxygen plasma generated by the oxygen ion generating means; and oxygen ion decelerating means for decelerating the separated oxygen ions to a speed corresponding to energy of 10 to 200 eV and for implanting the decelerated oxygen ions as an oxygen ion beam in a thin oxide film which is being formed on the substrate.

With the above constitution of the present invention, the method of manufacturing a thin compound oxide film and an apparatus for manufacturing a thin oxide film provide a thin film free from oxygen defects and composition errors. Therefore, a thin film has a density similar to a bulk value, and a substrate temperature can be reduced. Therefore, the crystallization initiation temperature can be reduced and low-temperature epitaxial growth is possible, wherein thin-film constituting elements diffuse in the direction of thickness of the thin film. According to the present invention, energy and ion beam density of the oxygen ion beam can fall within the optimal ranges, and thus precise composition control can be performed. Electrical and optical characteristics of the thin oxide film widely used in elements such as a light modulation element, a piezoelectric element, a surface acoustic wave element, a superconductor element, an LSI, and an EL can be greatly improved.

BRIEF DESCRIPTION OF THE DRAWINGS

FIG. 1 is a schematic view showing an arrangement of an apparatus for manufacturing a thin oxide film for realizing a method of forming a thin compound oxide film according to an embodiment of the present invention;

FIG. 2 is a graph showing the maximum oxygen ion current density as a function of oxygen ion energy generated by the apparatus shown in FIG. 1;

FIG. 3 is a side view of a thin compound oxide film formed on a substrate by the method of the present invention and the apparatus therefor;

FIG. 4 is a side view of a thin oxide film formed on a substrate through a buffer layer by the method of the present invention and the apparatus therefor according to another embodiment; and FIG. 5 is a side view of a thin oxide film having a multilayered structure formed by the method and the apparatus therefor according to still another embodiment of the present invention.

DETAILED DESCRIPTION OF THE PREFERRED EMBODIMENTS

A method of manufacturing a thin compound oxide film according to an embodiment of the present invention will be described with reference to the accompanying drawings. Metal materials (e.g., Nb and Li) for forming a thin compound oxide film are evaporated in a vacuum pressure of the order of $10^{-9}$ Torr or less (i.e., vacuum pressure of the order of $10^{-10}$ Torr, $10^{-11}$ Torr, etc.) because the substrate need not be heated to 500° C. or higher so that the adsorbed gas on the substrate surface does not prevent free movement of material particles bombarding on the substrate to a predetermined site thereon. A means for evaporating metal materials may comprise a resistive heater, an electron gun assembly, or a laser and is not limited to any specific type.

The substrate preferably comprises a single-crystal substrate having the same lattice constant as that of the thin film. If a substrate having a desired lattice constant cannot be obtained, a buffer layer having as a lattice constant an intermediate value between the lattice constant of the thin compound oxide film and the actual lattice constant of the substrate is formed on the substrate, thereby absorbing a lattice constant difference. Thereafter, a thin compound oxide film is formed on the buffer layer.

A heating temperature of the substrate is preferably about 400° C. or lower. When a thin film of a multilayered structure is formed at a temperature exceeding 400° C. or when a buffer layer is formed on the substrate and a thin compound oxide film is formed thereon at a temperature exceeding 400° C., diffusion of the material elements occurs in the direction of the multilayered thin film or the buffer layer. As a result, the properties of the thin film may be impaired. The lower limit of the temperature is practically about 200° C. The evaporated metal materials are deposited on the substrate. Oxygen ions $O^+$ or $O_2^+$ are doped in the thin film which is being formed on the substrate. These ions are generated by an ion source and the oxygen ions $O^+$ or $O_2^+$ are separated by a mass separator. The separated ions are decelerated by an ion deceleration electrode to a speed corresponding to energy of 10 to 200 eV. The decelerated oxygen ions are implanted in the thin film. If ion energy is less than 10 eV, energy for epitaxially growing the oxide film is insufficient. However, if ion energy exceeds 200 eV, the crystallized thin film may be damaged.

An apparatus for manufacturing a thin compound oxide film formed as described above according to the present invention will be described with reference to FIG. 1.

Substrate 3 held in holder 2 is placed in film formation chamber 11 shown in FIG. 1. Substrate 3 is heated by heater 18 to about 400° C. Heating of substrate 3 is performed as needed. K-cells 8 and 8" serving as molecular beam sources and electron beam vapor source 9 are located at positions opposite to substrate 3. K-cells 8 and 8" and vapor source 9 are used to evaporate different thin film materials, respectively. Film formation chamber 11 can be evacuated by a cryopump or the like to vacuum pressure of the order of $10^{-9}$ Torr or less. Ionizing chamber 10 comprises a plasma source (not shown) therein to generate an oxygen plasma. The generated ions $O^+$ or $O_2^+$ pass through mass separator 13 and oxygen ions $O^+$ or $O_2^+$ are separated thereby. Ionizing chamber 10 and film formation chamber 11 are separated from each other by gate valve 20 and can be independently evacuated. Oxygen ions $O^+$ or $O_2^+$ having high energy of 10 to 50 keV are decelerated to have energy of 10 to 200 eV by ion deceleration electrode 12. The decelerated oxygen ions $O^+$ or $O_2^+$ are neutralized by electrons emitted from electron emission source 17 made of a ring-like thermionic filament. Oxygen atoms or molecules O or $O_2$ are implanted at a constant speed or molecules O or $O_2$ are implanted at a constant speed in the thin film which is being formed on the substrate. When an insulating film is to be formed on the substrate, charging of the film can be prevented. In the illustrated embodiment, electron emission source 17 is arranged. However, this may be omitted. In this case, oxygen ions $O^+$ or $O_2^+$ may be doped in the thin film.

Ion gauge 14 (or a quartz oscillator) and mass analyzer 15 are located at predetermined positions inside film formation chamber 11. Intensities of molecular or ion beams emitted from K-cells 8 and 8' serving as the molecular beam sources or electron beam vapor source 9 are monitored, and monitor signals are fed back to control vapor amounts of the thin film materials.

The oxygen ion beam decelerated by deceleration electrode 12 is monitored by Faraday cup 16 arranged inside film formation chamber 11. Therefore, a current density (corresponding to the number of oxygen ions incident on the film) of oxygen ions incident on the thin film on substrate 3 can be detected by monitor signals. The current density is about 10 to 100 $\mu A/cm^2$. Under the above-described control, the thin compound oxide film formed on substrate 2 is subjected to high-precision composition control of constituting elements as well as high-precision control of energy and current density of the oxygen ion beam.

A method of manufacturing a thin film of a compound oxide will be described in more detail.

A microwave excitation ion source was used as ionizing chamber 10 shown in FIG. 1. Even if a strongly reactive oxygen gas was used, film formation continued for 10 hours or longer without maintenance of the ion source. The degree of vacuum in ionizing chamber 10 during operation was $5 \times 10^{-4}$ Torr. A portion between ionizing source 10 and mass separator 13 was evacuated by a cryopump (having a delivery rate of 700 l/sec) to maintain the degree of vacuum pressure of film formation chamber 11 to be $5 \times 10^{-9}$ Torr.

Ions were extracted from ionizing chamber 10 at an extraction voltage of 20 kV, and ions $O^+$ were separated by mass separator 13. Ions $O^+$ were decelerated by decelerating electrode 12 to a speed corresponding to energy of 10 to 200 eV. In this case, the oxygen ion current density as a function of energy after deceleration is shown in FIG. 2. As is apparent from FIG. 2, a maximum ion current density of 50 $\mu A/cm^2$ can be obtained at energy of, e.g., 50 eV.

EXAMPLE 1

Fabrication of Thin Film of Single Crystal LiNbO₃

C-plate sapphire (lattice constant aH=4.758 Å) was placed as substrate 3 on substrate holder 2 arranged inside film formation chamber 1 shown in FIG. 1.

The vacuum pressure was set to the order of $10^{-9}$ Torr or less, and substrate 3 was heated by heater 18 to a temperature of 350° C. Gate valve 20 was opened, and oxygen ions $O^+$ or $O_2^+$ generated by ionizing chamber 10 on the basis of plasma energy were accelerated and output. Only $O^+$ ions were separated by mass separator 13. The ions $O^+$ were decelerated to a speed corresponding to energy of about 100 eV through a slit of ion deceleration electrode 12. Oxygen ions $O^+$ were caused to pass through a thermion shower as electrons emitted from electron emission electrode 17. Therefore, neutral 0 atoms were bombarded on substrate 3.

Li was heated and evaporated from K-cells 8 and 8″ serving as molecular beam sources and Nb was evaporated by electron beam vapor source 9 to deposit Li and Nb on substrate 3. Meanwhile, 0 atoms were doped in the thin film so that an LiNbO₃ thin film was formed. The cross section of the thin film of the compound oxide prepared as described above is shown in FIG. 3.

As is apparent from FIG. 3, LiNbO₃ thin film 30 is deposited on substrate 3.

When a deposition rate of LiNbO₃ is 3,000 Å/hour and the thickness of the film was 3,000 Å to 1 μm, refractive index $n_o$ (ordinary light) and refractive index $n_e$ (extraordinary light) were respectively 2.32 and 2.18 for light having a wavelength of 6.33 Å. In this case, an electrooptical coefficient of the film was 29.3, which was close to a bulk coefficient.

It is assumed that the above results are obtained by oxygen implanting since the density of the deposited film is near a bulk density.

The LiNbO₃ thin film prepared in Example 1 had a light loss of 10 dB/cm.

EXAMPLE 2

Fabrication of LiNbO₃ Thin Film On Substrate with Buffer Layer

Prior to the steps in Example 1, a 100 to 300 Å thick Li(Nb, Ti)O$_x$ film having an intermediate lattice constant was formed on substrate 3 to absorb a difference between a lattice constant (4.75 Å) of sapphire substrate 3 and a lattice constant (5.14 Å) of LiNbO₃ and make epitaxial growth easier.

Following the same procedures as in Example 1, a thin film of an LiNbO₃ compound oxide was formed.

The cross section of the resultant film is shown in FIG. 4. In Example 2, buffer layer 31 is formed on substrate 3, and LiNbO₃ thin film 30 is formed on buffer layer 31.

Refractive indices $n_o$ and $n_e$ of the resultant thin film were respectively 2.29 and 2.2 for light having a wavelength of 6.328 Å, and an electrooptical coefficient (r33) thereof was 31.4, which were close to those of single crystal (bulk). These results are assumed to be obtained by the pressure of buffer layer 31 and an effect of oxygen implantation. The sample was too small to measure the light loss.

EXAMPLE 3

Fabrication of BaPbO₃-BaBiO₃ Multilayered Film

Metal particles or powders, i.e., Ba, Pb, and Bi particles or powders were put into K-cells 8 and 8′ and an additional K-cell (not shown) placed in film formation layer 1 shown in FIG. 1, respectively, and an SrTiO₃ (110 plane) single-crystal substrate was used as substrate 3.

The vacuum pressure was set to the order of $10^{-9}$ Torr or less, and a substrate temperature was set to 350° C. A first layer was formed on substrate 3, as indicated by the cross section of FIG. 5. More specifically, Ba and Bi were respetively evaporated from K-cells 8 and 8′. Oxygen ions $O^+$ or oxygen atoms O were doped in a BaBi film while Ba and Bi were being deposited on substrate 3, thereby forming BaBiO₃ layer 32. In this case, energy of oxygen ions $O^+$ or O was 100 eV.

The shutter of the additional K-cell was closed to stop evaporating Bi. Ba was continuously evaporated. In addition, Pb was evaporated. $O^+$ or O was doped in a BaPb film while Ba and Pb were being deposited on substrate 3, thereby forming BaPbO₃ layer 33.

By repeating the above steps, 30 BaBiO₃ layers 32 each having a thickness of 30 to 100 Å and 30 BaPbO₃ layers 33 were alternately formed to prepare a multilayered film.

Each thin film was a single-crystal film prepared by epitaxial growth. As a result of an X-ray diffraction test, a diffusion layer between each BaBiO₃ layer and the BaPbO₃ layer adjacent thereto had a thickness of 10 Å or less.

In Example 3, the multilayered film is epitaxially grown on a single-crystal substrate. However, when a polycrytalline film was formed on, e.g., a glass substrate, crystallization began at a low substrate temperature according to experiments. In Examples 1 to 3, the method of manufacturing compound oxides has been exemplified. However, thin oxide films can be formed by the apparatus shown in FIG. 1, and this will be described below.

Zn metal particles filled in K-cell 8 were evaporated, and a K-cell temperature was controlled such that a deposition rate on substrate 3 was set to 0.73 Å/sec. At the same time, when an oxygen ion beam having energy of 50 eV and a current density of 50 μA/cm² was incident on the glass substrate, the number of Zn atoms incident per unit area and per unit time was equal to that of 0 atoms, thus obtaining a polycrystalline ZnO film having a stoichiometric ratio Zn:0=1:1. In particular, R- or C-plane sapphire was used as a substrate and the substrate was kept at a constant temperature falling within the range of room temperature to 600° C. In this case, a ZnO single-crystal film having a smooth surface could be prepared. The degree of vacuum in film formation chamber 11 during Zn evaporation was $5\times10^{-8}$ Torr. A ZnO (11$\bar{2}$0) plane and a ZnO (0001) plane were respectively expitaxially grown on the sapphire R- and C-planes. In both cases, half-widths of the (11$\bar{2}$0) and (0001) peaks were as small as 0.3 or less according to an X-ray diffraction test. The ZnO lattice constant converted based on the peak position was substantially the same as the bulk value (a difference was 0.1% or less), thus presenting good crystallinity. In general, good crystallinity cannot be obtained by sputtering unless a substrate temperature is 600° C. or higher. According to the apparatus for manufacturing the thin oxide film according to the present invention, it is proved that a single-crystal film having good crystallinity can be prepared at a low substrate temperature.

What is claimed is:

1. A method of manufacturing a thin single crystal film of a compound oxide, comprising the steps of:
   maintaining a vacuum pressure in the order of $10^{-9}$ Torr or less;
   heating a substrate to a temperature of less than 400° C.;
   evaporating different types of materials for forming the compound oxide;
   depositing the evaporated materials on a substrate to form the thin film;
   generating oxygen ions, the oxygen ion generating step including the steps of generating an oxygen plasma, mass-separating oxygen ions from the accelerated oxygen plasma to separate $O^+$ or $O_2^+$ ions, and decelerating the separated oxygen ions to a speed corresponding to energy of 10 to 200 eV; and
   implanting oxygen ions, decelerated in the decelerating step and having energy of 10 to 200 eV, in the thin film as it is being formed on said substrate while monitoring and controlling the number of oxygen ions.

2. The method according to claim 1, further including the step of neutralizing the $O^+$ or $O_2^+$, which emits electrons to obtain the neutral oxygen particles, after the decelerating step.

3. The method according to claim 2, wherein the electron emitting step comprises the step of radiating electrons by an electron shower.

4. The method according to claim 1, wherein the step of depositing the evaporated materials on a substrate to form the thin film includes the step of forming a buffer layer on the substrate, a lattice constant of the buffer layer being an intermediate value between a lattice constant of the substrate and a lattice constant of the thin film.

5. The method according to claim 1, wherein the substrate comprises a single crystal and is heated to a temperature of about 400° C. or less.

6. The method according to claim 1, wherein the material evaporating step, the thin film forming step, and the oxygen ion implanting step are repeated a plurality of times to form a multilayered thin film of the compound oxide.

* * * * *